(12) United States Patent
Bertram

(10) Patent No.: US 7,075,354 B2
(45) Date of Patent: Jul. 11, 2006

(54) DYNAMIC MULTI-INPUT PRIORITY MULTIPLEXER

(75) Inventor: Raymond A. Bertram, Austin, TX (US)

(73) Assignee: VIA Technologies, Inc., Taipei (TW)

( * ) Notice: Subject to any disclaimer, the term of this patent is extended or adjusted under 35 U.S.C. 154(b) by 13 days.

(21) Appl. No.: 10/891,305

(22) Filed: Jul. 14, 2004

(65) Prior Publication Data

US 2005/0012540 A1    Jan. 20, 2005

Related U.S. Application Data

(60) Provisional application No. 60/487,764, filed on Jul. 16, 2003.

(51) Int. Cl.
*H03K 17/62* (2006.01)

(52) U.S. Cl. ............... 327/403; 327/404; 326/95

(58) Field of Classification Search ............ None
See application file for complete search history.

(56) References Cited

U.S. PATENT DOCUMENTS

| | | | | |
|---|---|---|---|---|
| 3,826,901 A | * | 7/1974 | Band et al. | 708/103 |
| 5,319,254 A | * | 6/1994 | Goetting | 327/198 |
| 5,724,553 A | * | 3/1998 | Shigeeda | 711/170 |
| 5,742,180 A | * | 4/1998 | DeHon et al. | 326/40 |
| 5,790,539 A | * | 8/1998 | Chao et al. | 370/390 |
| 5,822,758 A | * | 10/1998 | Loper et al. | 711/130 |
| 5,835,733 A | * | 11/1998 | Walsh et al. | 710/303 |
| 5,955,912 A | * | 9/1999 | Ko | 327/410 |
| 6,049,231 A | * | 4/2000 | Bosshart | 326/98 |
| 6,169,438 B1 | * | 1/2001 | Wu et al. | 327/276 |
| 6,201,415 B1 | * | 3/2001 | Manglore | 326/98 |
| 6,366,130 B1 | * | 4/2002 | Podlesny et al. | 326/95 |
| 6,876,232 B1 | * | 4/2005 | Yoo | 326/98 |
| 6,879,186 B1 | * | 4/2005 | Liu | 326/98 |
| 6,891,400 B1 | * | 5/2005 | Yeager et al. | 326/98 |
| 6,963,228 B1 | * | 11/2005 | Azam | 326/98 |
| 6,995,586 B1 | * | 2/2006 | Campbell | 326/95 |
| 2004/0047374 A1 | * | 3/2004 | Wielgosz et al. | 370/537 |
| 2005/0036444 A1 | * | 2/2005 | Park et al. | 370/222 |

* cited by examiner

*Primary Examiner*—Tuan T. Lam
*Assistant Examiner*—Hiep Nguyen
(74) *Attorney, Agent, or Firm*—Gary R. Stanford; Richard K. Huffman; James W. Huffman

(57) ABSTRACT

A dynamic priority multiplexer including a complementary pair of evaluation devices responsive to a clock signal defining evaluation periods, and multiple evaluation legs coupled in cascade between a top node and a bottom node and arranged in order of priority. The complementary pair includes a pull-up device that pre-charges the top node and a pull-down device that pulls the bottom node low during evaluation. Each higher priority evaluation leg receives a corresponding select signal and a corresponding data signal and includes a corresponding pass device. A select signal, when asserted, enables evaluation of a corresponding data signal and disables a corresponding pass device. The lowest priority evaluation leg includes a pull-down data device that receives a lowest priority data signal and which is coupled between a pass device of a higher priority evaluation leg and the bottom node.

21 Claims, 4 Drawing Sheets

DYNAMIC MULTI-INPUT PRIORITY MULTIPLEXER

CROSS-REFERENCE TO RELATED APPLICATIONS

This application claims the benefit of U.S. Provisional Application Ser. No. 60/487,764, filed on Jul. 16, 2003, which is herein incorporated by reference for all intents and purposes.

BACKGROUND OF THE INVENTION

1. Field of the Invention

The present invention relates to priority multiplexing schemes, and more particularly to a dynamic multiple-input priority multiplexer (MUX) that is faster than conventional dynamic MUXs and which does not require select signal generation logic to ensure exclusive assertion of select inputs.

2. Description of the Related Art

Integrated circuits (ICs), particularly those implementing synchronous pipeline architectures, use a relatively large number registers. Register logic holds the outputs of devices and/or circuits for some period of time so that these outputs can be received by other devices/circuits. In clocked systems, including pipeline microprocessors, registers are employed to latch and hold the outputs of a given pipeline stage so that input circuits in a subsequent stage can receive the outputs during the period when the given pipeline stage is generating new outputs.

In conventional designs, it has been common practice to follow complex logical evaluation circuits with registers that latch and hold the outputs of the evaluation circuits. The "speed" of a register is generally measured in terms of its data-to-output time, that is, the sum of its setup time requirement and its clock-to-output time. The overall operating speed of the system is limited by the delays associated with the logic evaluation circuits plus the speed of the register.

To gain speed, logic designers are presently designing priority multiplexer (MUX) circuits that combine as much of the logic evaluation functions as possible with their corresponding registers. The priority MUX circuits may further use a dynamic multiple-input MUXing stage to gain speed since dynamic circuits are very fast compared to conventional logic evaluation configurations. In the general case, one of M data signals is selected based on assertion of one of M−1 select signals. It is the responsibility of the select signal generation logic to ensure that the select signal assertion is exclusive since otherwise the state of the dynamic logic evaluant is dictated by the state of all selected inputs in a NOR-type configuration.

As alluded to above, select signal generation logic must be used to ensure exclusivity so that only one of the select signals is asserted at any given time. This adds delay to logic evaluation and slows overall system speed. Also, an area penalty is imposed on this type of logic.

SUMMARY OF THE INVENTION

A dynamic priority multiplexer according to an embodiment of the present invention includes a complementary pair of evaluation devices responsive to a clock signal defining evaluation periods, and multiple evaluation legs coupled in cascade between a top node and a bottom node and arranged in order from highest to lowest priority. The complementary pair includes a pull-up evaluation device that pre-charges the top node and a pull-down evaluation device that pulls the bottom node low during evaluation. Each higher priority evaluation leg receives a corresponding select signal and a corresponding data signal and includes a corresponding pass device. A select signal, when asserted, enables evaluation of a corresponding data signal and disables a corresponding pass device. The lowest priority evaluation leg includes a pull-down data device that receives a lowest priority data signal and which is coupled between a pass device of a higher priority evaluation leg and the bottom node.

In one embodiment, each higher priority evaluation leg includes a corresponding evaluation node in which the evaluation node of the highest priority evaluation leg is the top node, a pre-charge device, a pull-down data device, a pull-down pass device and a pull-down select device. The pre-charge device is responsive to the clock signal and pre-charges a corresponding select node. The pull-down data device is coupled between a corresponding select node and a corresponding evaluation node and receives a corresponding data signal. The pull-down pass device is coupled between consecutive evaluation nodes of consecutive evaluation legs. The pull-down select device is coupled between a corresponding select node and the bottom node and receives a corresponding select signal, enables evaluation of a corresponding data signal when selected and enables evaluation by lower priority evaluation legs when not selected. An additional pre-charge device responsive to the clock signal may be provided to pre-charge the bottom node. Strong pull-down devices may further be provided, each coupled between consecutive evaluation nodes and receiving a corresponding data signal. Keeper devices may be provided, each coupled to a corresponding select node. Additional pre-charge devices may be provided to pre-charge each of the evaluation nodes.

A multiple input priority multiplexer according to an embodiment of the present invention includes a first P-channel device, multiple second P-channel devices, a third P-channel device, a first N-channel device, and multiple second, third and fourth N-channel devices. The first P-channel device has a gate receiving a clock signal, a source coupled to a voltage source, and a drain coupled to a first one of multiple evaluation nodes. Each second P-channel device has a gate receiving the clock signal, a source coupled to the voltage source, and a drain coupled to a corresponding select node. The third P-channel device has a gate receiving the clock signal, a source coupled to the voltage source, and a drain coupled to a bottom node. The first N-channel device has a drain coupled to the bottom node, a gate receiving the clock signal, and a source coupled to a common node. Each second N-channel device has a drain coupled to a corresponding evaluation node, a gate receiving a corresponding data signal, and a source coupled to a corresponding select node except the last second N-channel device, which has its source coupled to the bottom node. Each third N-channel devices has a drain coupled to a corresponding select node, a gate receiving a corresponding select signal, and a source coupled to the bottom node. Each fourth N-channel device has a drain coupled to a corresponding evaluation node, a gate coupled to a corresponding select node, and a source coupled to a drain of a corresponding second N-channel device.

The multiple input priority multiplexer may further include multiple fifth N-channel devices, each having a drain coupled to a corresponding evaluation node, a gate receiving a corresponding data signal, and a source coupled to a source of a corresponding fourth N-channel device. The multiple input priority multiplexer may further include multiple fourth P-channel devices, each having a gate receiving the clock signal, a source coupled to the voltage source, and a drain coupled to a corresponding evaluation node. The multiple input priority multiplexer may further include keeper devices coupled to the select nodes.

A method of dynamically multiplexing a plurality of prioritized input data signals includes separating dynamic evaluation legs into priority order with pass devices and coupling the evaluation legs between an output evaluation node and a bottom node, generating a clock signal to define evaluation periods for pre-charging each evaluation leg and pre-activating each pass device, providing each of multiple data signals to a corresponding one of multiple evaluation legs, evaluating a data signal by selecting a corresponding evaluation leg during an evaluation period, and de-activating a corresponding pass device to disable evaluation of lower priority evaluation legs if the selected evaluation leg is not the lowest priority leg.

The method may include coupling a lowest priority evaluation leg between the bottom node and a last pass device, providing a lowest priority data signal to the lowest priority evaluation leg, pre-charging the bottom node, and selecting the lowest priority data signal by default if none of the higher priority evaluation legs are selected. The method may include providing each evaluation leg with an evaluation node in which the output evaluation node is the evaluation node for a highest priority evaluation leg, and coupling a pass device between adjacent evaluation nodes. The method may include coupling a data device between a corresponding evaluation node and a corresponding select node of each evaluation leg, providing a corresponding data signal to the data device, controlling the pass device of each evaluation leg with a corresponding select node, coupling a select device between the bottom node and a corresponding select node of each evaluation leg, providing a corresponding select signal to the select device, and pre-charging each select node. The method may further include controlling a second data device coupled between adjacent evaluation nodes with a corresponding data signal. The method may further include pre-charging each evaluation node of each of the plurality of evaluation legs. The method may further include periodically pulsing the clock signal high to initiate each evaluation period.

BRIEF DESCRIPTION OF THE DRAWINGS

The benefits, features, and advantages of the present invention will become better understood with regard to the following description, and accompanying drawings where.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

The inventor of the present application has recognized the need for registering the output(s) of complex logic circuits where speed and size are critical factors. He has therefore developed a dynamic multiple-input priority multiplexer which is faster than conventional dynamic multiplexers and that does not require select generation logic, as will be further described below with respect to FIGS. 1–5.

Figure 1:
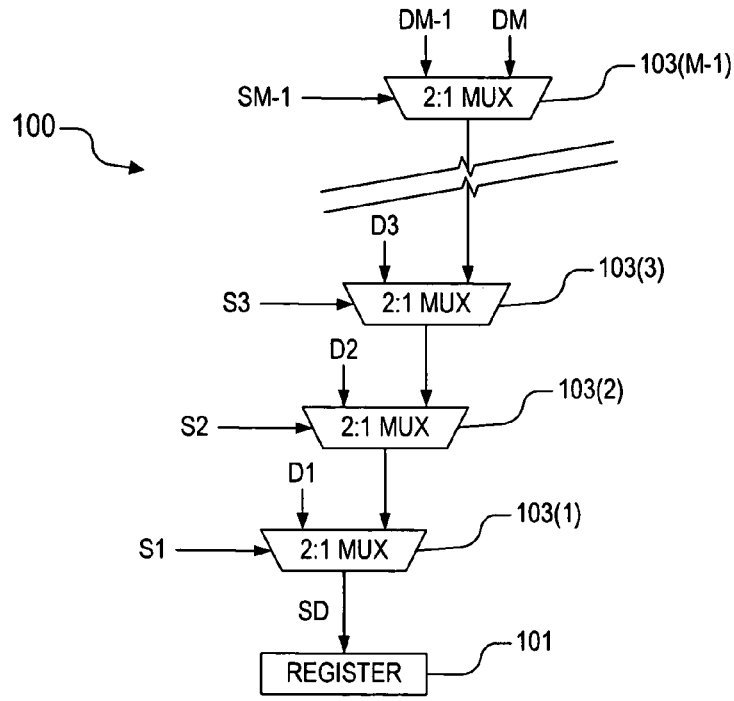
FIG. 1 is a schematic diagram of a priority multiplexing stage implemented according to a first conventional embodiment.

FIG. 1 is a schematic diagram of a priority multiplexing (MUXing) stage 100 implemented according to a first conventional embodiment. The priority MUXing stage 100 includes an output register 101 preceded by M−1 2:1 MUXs 103 for selecting one of M data signals D1–DM based on the priority of M−1 select signals S1–SM−1, where "M" is a positive integer greater than 1. The MUXs 103 are individually labeled 103(1), 103(2), . . . , 103(M−1), where the first, highest priority MUX 103(1) provides a selected data signal SD to the input of the register 101. The first MUX 103(1) receives the first select signal S1 at its select input, the first data signal D1 at its first data input, and the output of the second MUX 103(2) at its second data input, the second MUX 103(2) receives the second select signal S2 at its select input, the second data signal D2 at its first data input, and the output of the third MUX 103(3) at its second data input, and so on up to the last MUX 103(M−1) which receives the last select signal SM−1 at its select input, the second to last data signal DM−1 at its first data input, and the last or Mth data signal DM at its second data input. In this case, the first select signal S1 has highest priority and SM−1 has the lowest priority, so that the first data signal D1 is provided as the selected data signal SD if S1 is asserted, the second data signal D2 is selected if S2 is asserted and S1 is de-asserted, and so on. The Mth data signal DM is selected only if all M−1 select signals S1–SM−1 are de-asserted.

Figure 2:
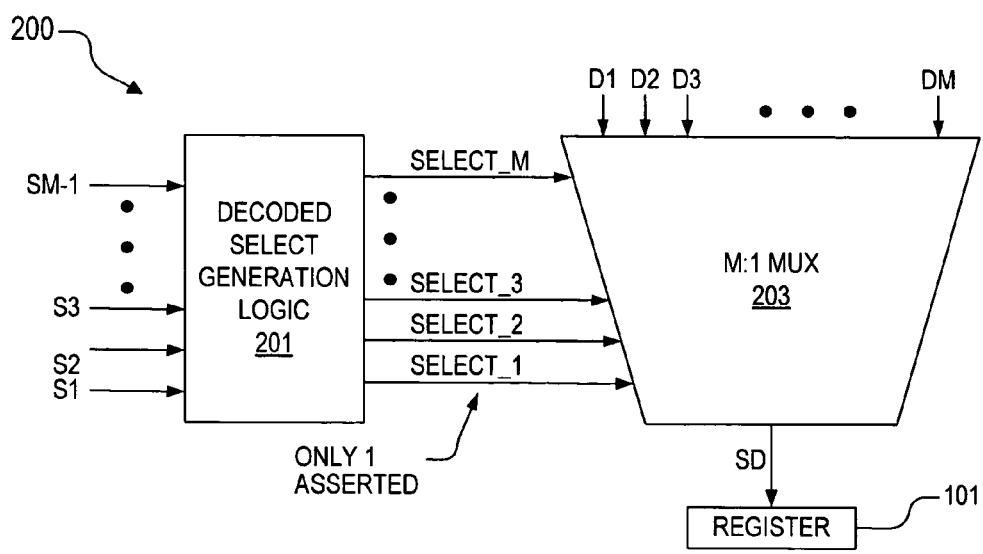
FIG. 2 is a schematic diagram of a priority multiplexing stage implemented according to a second conventional embodiment.

FIG. 2 is a schematic diagram of a priority MUXing stage 200 implemented according to a second conventional embodiment. The priority MUXing stage 200 includes decoded select generation logic 201, an M:1 MUX 203, and the register 101. The decoded select generation logic 201 receives the M−1 select signals S1–SM−1 and asserts a corresponding one of M select signals SELECT_1, SELECT_2, . . . , SELECT_M to the select inputs of the M:1 MUX 203. The decoded select generation logic 201 operates to assert the SELECT_X signal (where "X" is an integer from 1 to M) corresponding to the highest priority one of the select signals S1–SM−1 that is asserted, where S1 is the highest priority and SM−1 is the lowest priority. Thus, if S1 is asserted, then the decoded select generation logic 201 asserts only the SELECT_1 signal, if S2 is asserted and S1 is not, then only the SELECT_2 signal is asserted, and so on.

If none of the S1–SM–1 signals is asserted, then the decoded select generation logic 201 asserts the lowest priority SELECT_M signal. The MUX 203 receives the M data signals D1–DM at its data inputs and outputs a selected one of the input data signals corresponding to the asserted one of the SELECT_1–SELECT_M signals as the select data signal SD to the register 101.

Figure 3:
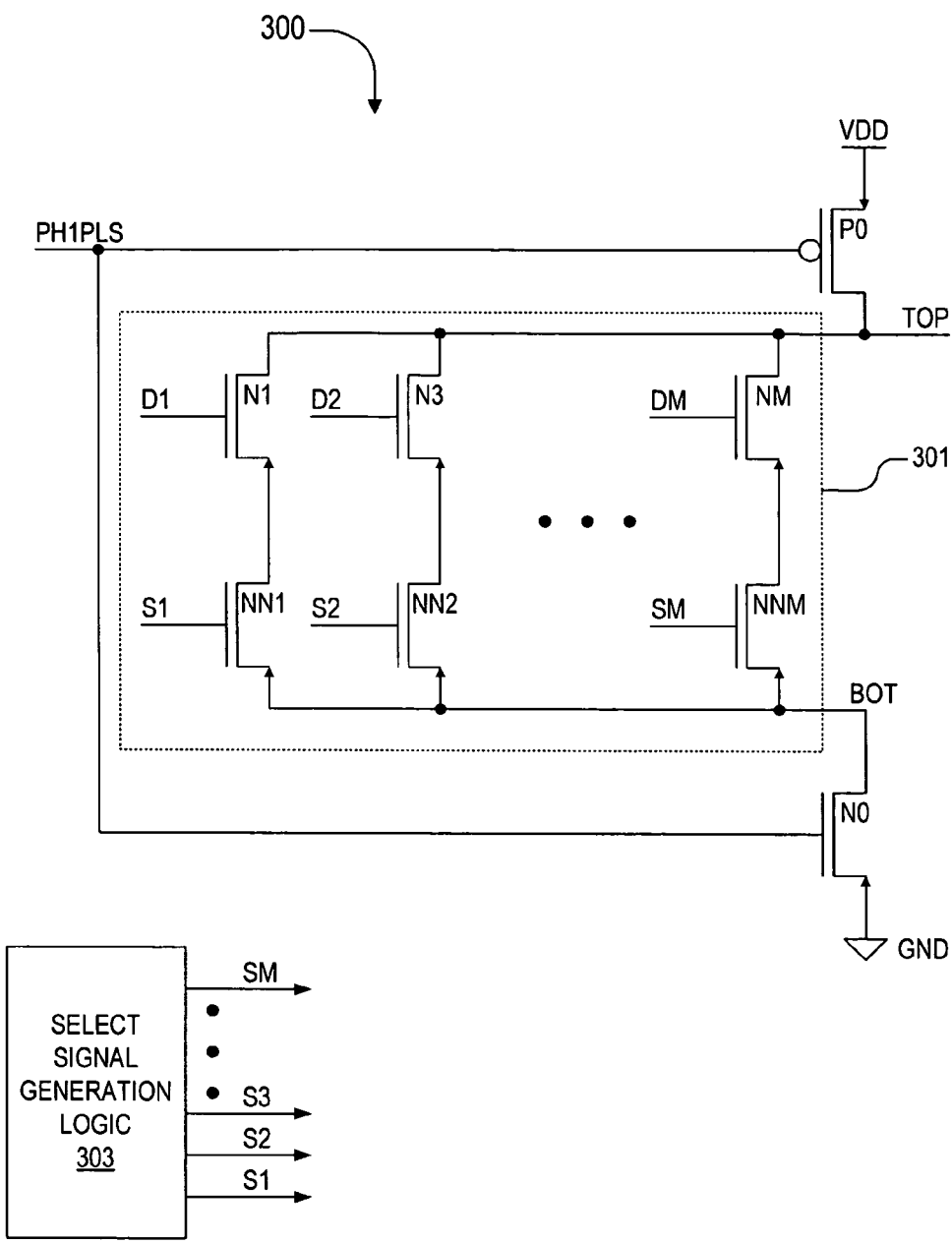
FIG. 3 is a schematic diagram of a dynamic M-input multiplexing stage, illustrating an exemplary conventional dynamic configuration for combining the priority multiplexing stage of FIG. 2 with the register of FIG. 1.

FIG. 3 is a schematic diagram of a dynamic M-input MUXing stage 300, illustrating an exemplary conventional dynamic configuration for combining the priority MUXing stage 200 with the register 101. As appreciated by those of ordinary skill in the art, dynamic circuits are faster than conventional logic evaluation configurations and thus may be employed for logic circuits in which speed is a critical factor. The MUXing stage 300 includes a P-channel device P0, an N-channel device N0, an M-input MUX 301 and select signal generation logic 303. A clock pulse signal PH1PLS is provided to the gates of P0 and N0, where the source of P0 is coupled to a voltage source VDD and the source of N0 is coupled to a common or reference node, such as ground (GND). The drain of P0 is coupled to an evaluation node TOP and the drain of N0 is coupled to a lower or bottom node referred to as BOT. The MUX 301 is formed between the TOP and BOT nodes and includes M N-channel data devices N1–NM and another M N-channel select devices NN1–NNM. The drain of each of the data devices N1–NM is coupled to TOP and the source is coupled to the drain of a corresponding one of the select devices NN1–NNM, which have their sources coupled to BOT. The gates of the devices N1–NM receive the M data signals D1–DM, respectively, and the gates of the devices NN1–NNM receive M select signal S1–SM, respectively, which are provided by the select signal generation logic 303.

The clock pulse signal PH1PLS is initially low turning on P0 thus pre-charging TOP high. While PH1PLS is low, N0 is turned off. Upon a rising edge of PH1PLS initiating an evaluation period, P0 is turned off and N0 is turned on pulling BOT low. The MUX 301 is a logic evaluation or domino stage providing an output signal TOP developed on the TOP node. A node and the signal it develops is referred to by the same name unless otherwise specified. The TOP signal is provided, for example, to a following stage (not shown) that stores the evaluated state of TOP until the next evaluation edge of PH1PLS. Similar to the decoded select generation logic 201, the select signal generation logic 303 asserts only one of the select signals S1–SM when the PH1PHL signal is asserted high, and the corresponding data signal determines the state of TOP, which evaluates low on the rising edge of PH1PLS. A signal SX (representing one of the select signals S1–SM in which "X" is an integer from 1 to M) asserted high turns on the corresponding device NNX, and if the corresponding data signal DX is also asserted high turning on the device NX, then TOP is pulled low via the devices NX and NNX. If the data signal DX is instead low, then TOP remains high during the evaluation period while PH1PLS is high. Thus, an input data signal DX is selected for evaluation by asserting a corresponding select signal SX. It is the responsibility of the select signal generation logic 303 to ensure that the select signal assertion is exclusive (i.e., so that only one of the S1–SM select signals is asserted while PH1PLS is high), since otherwise the state of the logic evaluant, TOP, is dictated by the state of multiple selected inputs in a NOR-type configuration. If any of the selected input data signals is high, then TOP is driven low regardless of the state of the data signal intended to be selected.

The select signal generation logic 303 must be configured to ensure that only one of the select signals S1–SM is asserted during the evaluation period while PH1PLS is high. Such requirement adds delay to the logic evaluation, slows overall system speed and potentially degrades overall system performance. As appreciated by those skilled in the art, an area penalty is also imposed on exclusive select signal generation logic.

Figure 4:
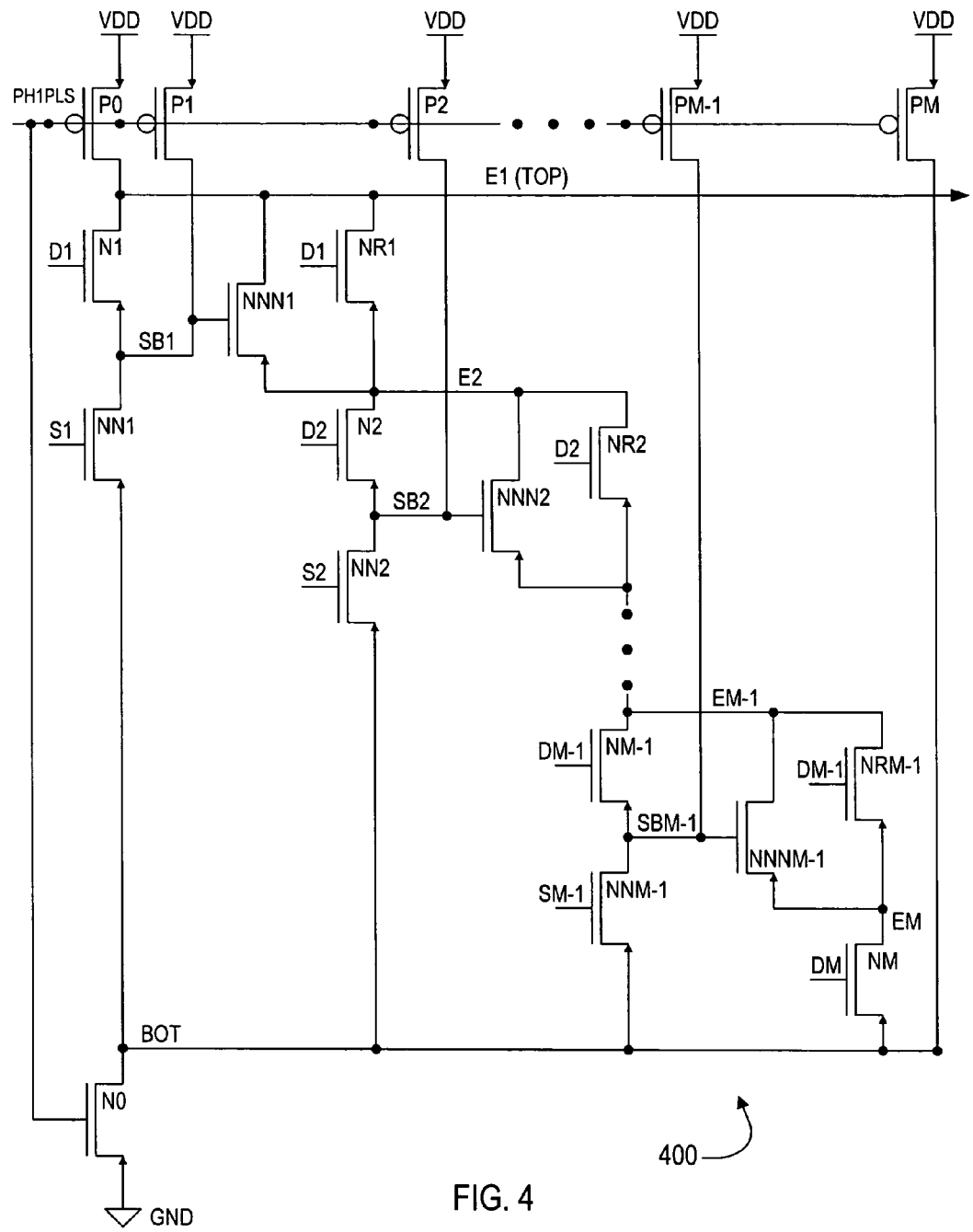
FIG. 4 is a schematic diagram of a dynamic multiple-input priority multiplexing stage implemented according to an exemplary embodiment of the present invention.

FIG. 4 is a schematic diagram of a dynamic multiple-input priority MUXing stage 400 implemented according to an exemplary embodiment of the present invention. The MUXing stage 400 performs a similar function as the conventional stages 100–300 in which it evaluates M data inputs D1–DM based on M–1 select signals S1–SM–1. The MUXing stage 400, however, is faster than conventional dynamic MUXes, does not require select generation logic (e.g., 201, 303), and implements a priority select function. The PH1PLS clock pulse signal is provided to the gates of a P-channel device P0 and an N-channel device N0, where the source of P0 is coupled to VDD, the drain of P0 is coupled to an evaluation node TOP, the source of N0 is coupled to GND, and the drain of N0 is coupled to the node BOT in a similar fashion as the dynamic M-input MUXing stage 300. The MUXing stage 400 includes M evaluation nodes E1–EM, where the first evaluation node E1, is also the output node and is the same node as TOP.

The MUXing stage 400 is divided into M "staggered" or "cascaded" legs coupled between TOP and BOT, in which the legs numbered 1 to M–1 each include a P-channel pull-up device PX, an N-channel data device NX, an N-channel select device NNX, an N-channel pass device NNNX, and an N-channel strong device NRX, where "X" is an integer from 1 to M–1 representing the corresponding leg of stage 400. For each of the first M–1 legs, the pull-up device PX has its source coupled to VDD, its gate receiving the PH1PLS signal, and its drain coupled to a corresponding select node SBX. Each data device NX has its drain coupled to the corresponding evaluation node EX, its source coupled to the corresponding select node SBX, and its gate receiving the corresponding input data signal DX. Each select device NNX has its drain coupled to the corresponding select node SBX, its source coupled to BOT, and its gate receiving the corresponding select signal SX. Each pass device NNNX has its drain coupled to the corresponding evaluation node EX, its source coupled to the evaluation node of the next subsequent stage EX+1, and its gate coupled to the corresponding select node SBX. Each N-channel strong device NRX has its drain coupled to the corresponding evaluation node EX, its source coupled to the evaluation node of the next subsequent stage EX+1, and its gate receiving the corresponding data signal DX. The last or Mth leg includes an N-channel device NM having its drain coupled to the corresponding evaluation node EM, its source coupled to BOT, and its gate receiving the corresponding data signal DM. Also, a final pull-up P-channel device has its source coupled to VDD, its gate receiving the PH1PLS signal, and its drain coupled to BOT.

In operation, prior to each evaluation period when PH1PLS is low, nodes E1, SB1–SBM–1, and BOT are pre-charged high through devices P0–PM, respectively. The pass devices NNN1–NNNM–1 are therefore conditioned on. Nodes E2–EM are also pre-charged high through devices NNN1–NNNM–1, respectively. Upon the rising edge of PH1PLS initiating an evaluation period, the BOT node is driven low through device N0. For each leg numbered X, if the corresponding select signal SX is asserted, then the corresponding select device NNX is turned on and the corresponding select node SBX is driven low. This turns off the corresponding pass device NNNX. Thus, when the select signal SX of a leg is asserted turning on the corresponding select device NNX, the corresponding pass device NNNX is turned off effectively disabling evaluation by lower priority legs, conditioned upon the state of the input data signal DX that corresponds to the select signal SX. This provides the staggered or cascade feature in which a selected higher priority leg disables evaluation of remaining lower priority legs. If the corresponding data signal DX is low, then the strong device NRX is turned off and all paths from subsequent (lower priority) nodes EX+1–EM are disabled and the corresponding evaluation node EX remains high. If the corresponding data signal DX is high, then the corresponding data device NX is turned on and the evaluation node EX is driven low. On the other hand, if the corresponding select signal SX is not asserted on the rising edge of PH1PLS, then the select device NNX is turned off and the corresponding select node SBX remains high keeping the corresponding pass device NNNX enabled. Enabled higher priority pass devices provide a path for subsequent (lower priority) nodes EX+1–EM to be propagated up to the first priority evaluation node E1 or TOP.

In the case where the corresponding data signal DX is asserted and the next evaluation node EX+1 is being pulled down (by select device NNX and data device DX+1 both being turned on), then the select node SBX might also be pulled down at the same time through devices NNNX and NX, which potentially undermines circuit performance. Hence, the strong device NRX is provided for each leg as an alternative strong path for this condition to facilitate proper circuit performance. The final evaluation node EM is always driven low at the start of each evaluation period in which the data signal DM is asserted high. In general, each evaluation node EX is allowed to propagate to the next higher priority evaluation node EX−1 if the next higher priority select signal SX−1 is not asserted. In this manner, the MUXing stage 400 implements a dynamic priority MUXing function.

Figure 5:
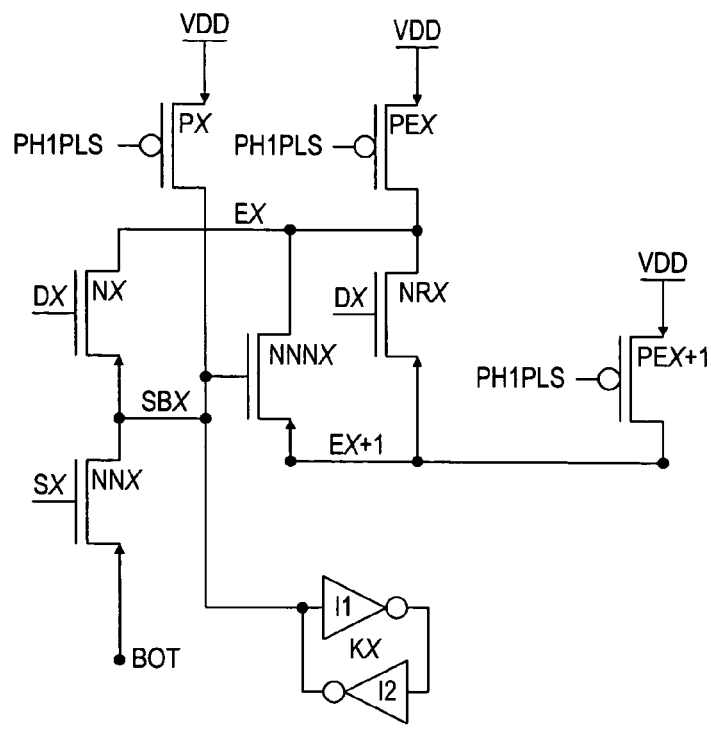
FIG. 5 is a schematic diagram of an exemplary leg numbered X of the multiplexing stage of FIG. 4 representing any of the stages 1–M−1, which includes additional devices for robustness.

FIG. 5 is a schematic diagram of an exemplary leg numbered X of the MUXing stage 400 representing any of the stages 1–M−1, which includes additional devices for robustness. In one alternative embodiment, keeper devices that hold a high state are placed on the select nodes SB1–SBM−1. As illustrated, a keeper device KX is coupled to the node SBX (representing a keeper device K1 for node SB1, a keeper device K2 for node SB2, and so on). In this case, the keeper device KX includes cross-coupled inverters I1 and I2 (output of I1 coupled to input of I2 and vice-versa) as known to those skilled in the art, which operates to keep the corresponding select node SBX asserted at a high state unless otherwise pulled low by the select device NNX. Note that inverter I1, having its input coupled to SBX, inverts the state of SBX which is inverted again by the inverter I2, which drives SBX to maintain its state. In another alternative embodiment, pre-charge devices are coupled directly to the evaluation nodes E2-EM. As illustrated, a first P-channel device PEX is coupled in a similar manner as the P-channel device PX and responsive to PH1PLS except having its drain coupled to corresponding evaluation node EX, a second P-channel device PEX+1 is coupled in a similar manner as the P-channel device PEX and responsive to PH1PLS and has its drain coupled to the corresponding evaluation node EX+1, and so on.

Figure 6:
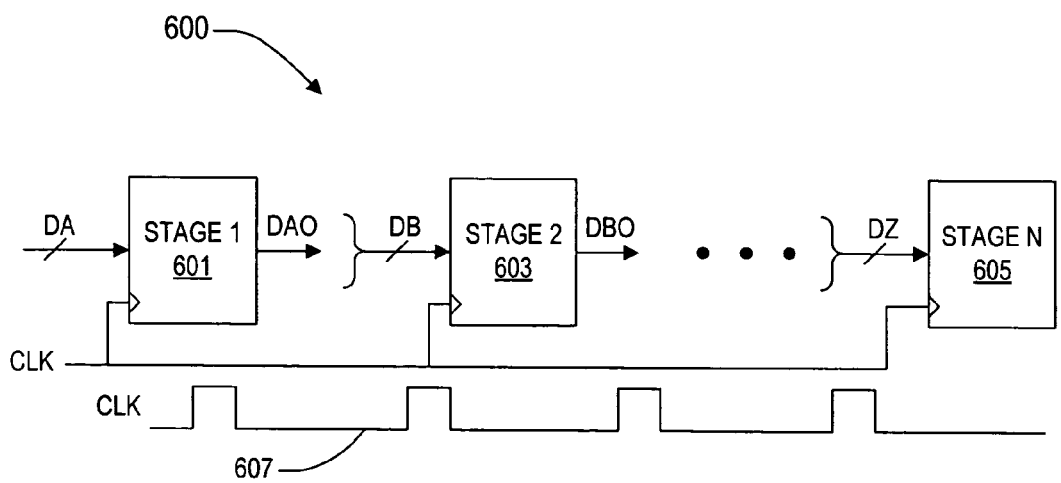
FIG. 6 is a simplified block diagram of a chain of domino stages each clocked by a normal clock waveform, including at least one stage implemented according to the multiple-input priority multiplexing stage of FIG. 4.

The MUXing stage 400 can also be used as a first stage 601 in a chain of domino stages 600 clocked by a normal clock waveform CLK rather than a pulse clock signal. This is illustrated in FIG. 6, where the first stage 601 of the multiple domino stages 600 is implemented using the MUXing stage 400 and each of the multiple domino stages 600 is clocked with CLK having a shape similar to that shown at 607. The first stage 601 evaluates multiple input data signals DA and generates an output signal DAO, which becomes one of multiple input data signals DB to a second stage 603 which generates an output signal DBO, and so on up to a last stage 605 (Nth of N stages), which evaluates multiple input data signals DZ. In either the clock pulse or normal clock waveform case, first stage input data signals DA must be held through the evaluation phase of the clock signal, e.g., while it is asserted high. A pulse clock signal provides the advantage of a relatively short duration required for holding the input signals DA valid.

In an alternative embodiment, the MUXing stage 400 is used as a first stage 601 in a chain of two domino stages 600 clocked by a normal clock waveform CLK or pulse clock signal. This is illustrated in FIG. 6, where the first stage 601 is implemented using the MUXing stage 400, the intervening stages 603 are eliminated, and the final stage 605 implements a latch 605. Together, these two stages 601, 605 implement a register with a priority mux function. One skilled in the art will appreciate that other embodiments are contemplated by the present invention.

Although the present invention has been described in considerable detail with reference to certain preferred versions thereof, other versions and variations are possible and contemplated. For example, the P-channel and N-channel devices are illustrated as Complementary Metal-Oxide-Semiconductor (CMOS) type devices, which may be replaced with suitable alternatives and supporting devices, such as bipolar devices or the like. Those skilled in the art should appreciate that they can readily use the disclosed conception and specific embodiments as a basis for designing or modifying other structures for providing out the same purposes of the present invention without departing from the spirit and scope of the invention as defined by the appended claims.

What is claimed is:

1. A dynamic priority multiplexer, comprising:
    a complementary pair of evaluation devices responsive to a clock signal defining evaluation periods, said complementary pair comprising a pull-up evaluation device that pre-charges a top node and a pull-down evaluation device that pulls a bottom node low during evaluation;
    a plurality of evaluation legs coupled in cascade between said top and bottom nodes and arranged in order from a highest priority evaluation leg to a lowest priority evaluation leg, each higher priority evaluation leg receiving a corresponding one of a plurality of select signals and a corresponding one of a plurality of data signals and including a corresponding one of a plurality of pass devices;
    wherein said corresponding select signal, when asserted, enables evaluation of a corresponding data signal and disables a corresponding pass device; and
    wherein said lowest priority evaluation leg comprises a pull-down data device that receives a lowest priority data signal and which is coupled between a pass device of a higher priority evaluation leg and said bottom node.

2. The dynamic priority multiplexer of claim 1, wherein each higher priority evaluation leg comprises:
    a corresponding one of a plurality of evaluation nodes, said highest priority evaluation leg having said top node as its corresponding evaluation node;
    a pre-charge device, responsive to said clock signal, that pre-charges a corresponding one of a plurality of select nodes;

a pull-down data device, coupled between said corresponding select node and a corresponding evaluation node, that receives a corresponding data signal;

a pull-down pass device coupled between consecutive evaluation nodes of consecutive evaluation legs; and a pull-down select device, coupled between said corresponding select node and said bottom node and that receives a corresponding select signal, that enables evaluation of a corresponding data signal when selected and that enables evaluation by lower priority evaluation legs when not selected.

3. The dynamic priority multiplexer of claim 2, further comprising an additional pre-charge device, responsive to said clock signal, that pre-charges said bottom node.

4. The dynamic priority multiplexer of claim 2, further comprising a plurality of strong pull-down devices, each coupled between consecutive evaluation nodes and receiving a corresponding data signal.

5. The dynamic priority multiplexer of claim 4, wherein each strong pull-down device comprises an N-channel device.

6. The dynamic priority multiplexer of claim 2, further comprising a plurality of keeper devices, each coupled to a corresponding select node.

7. The dynamic priority multiplexer of claim 2, further comprising a plurality of additional pre-charge devices, each coupled to a corresponding evaluation node.

8. The dynamic priority multiplexer of claim 7, wherein each additional pre-charge device comprises a P-channel device.

9. The dynamic priority multiplexer of claim 2, wherein said pre-charge device of each of said plurality of higher priority evaluation legs comprises a P-channel device and wherein each of said pull-down data, pass, and select devices of said plurality of higher priority evaluation legs comprises an N-channel device.

10. The dynamic priority multiplexer of claim 1, wherein said complementary pair of evaluation devices comprises a P-channel device and an N-channel device.

11. A multiple input priority multiplexer, comprising:

a first P-channel device having a gate receiving a clock signal, a source coupled to a voltage source, and a drain coupled to a first one of a plurality of evaluation nodes;

a plurality of second P-channel devices, each having a gate receiving said clock signal, a source coupled to said voltage source, and a drain coupled to a corresponding one of a plurality of select nodes;

a third P-channel device having a gate receiving said clock signal, a source coupled to said voltage source, and a drain coupled to a bottom node;

a first N-channel device having a drain coupled to said bottom node, a gate receiving said clock signal, and a source coupled to a common node;

a plurality of second N-channel devices, each having a drain coupled to a corresponding evaluation node, a gate receiving a corresponding one of a plurality of data signals, and a source;

wherein each source of said plurality of second N-channel devices is coupled to a corresponding select node except a last second N-channel device, which has its source coupled to said bottom node;

a plurality of third N-channel devices, each having a drain coupled to a corresponding select node, a gate receiving a corresponding one of a plurality of select signals, and a source coupled to said bottom node; and a plurality of fourth N-channel devices, each having a drain coupled to a corresponding evaluation node, a gate coupled to a corresponding select node, and a source coupled to a drain of a corresponding second N-channel device.

12. The multiple input priority multiplexer of claim 11, further comprising a plurality of fifth N-channel devices, each having a drain coupled to a corresponding evaluation node, a gate receiving a corresponding data signal, and a source coupled to a source of a corresponding fourth N-channel device.

13. The multiple input priority multiplexer of claim 11, further comprising a plurality of fourth P-channel devices, each having a gate receiving said clock signal, a source coupled to said voltage source, and a drain coupled to a corresponding evaluation node.

14. The multiple input priority multiplexer of claim 11, further comprising a plurality of keeper devices, each coupled to a corresponding select node.

15. A method of dynamically multiplexing a plurality of prioritized input data signals, comprising:

separating a plurality of dynamic evaluation legs into priority order with pass devices and coupling the evaluation legs between an output evaluation node and a bottom node;

generating a clock signal to define evaluation periods for pre-charging each evaluation leg and pre-activating each pass device;

providing each of a plurality of data signals to a corresponding one of the plurality of evaluation legs;

evaluating a data signal by selecting a corresponding evaluation leg during an evaluation period; and de-activating a corresponding pass device to disable evaluation of lower priority evaluation legs when the selected evaluation leg is not the lowest priority leg.

16. The method of claim 15, wherein:

said separating and coupling includes coupling a lowest priority evaluation leg between the bottom node and a last pass device;

wherein said providing includes providing a lowest priority data signal to the lowest priority evaluation leg;

wherein said pre-charging each evaluation leg includes pre-charging the bottom node; and selecting the lowest priority data signal by default when none of the higher priority evaluation legs are selected.

17. The method of claim 15, further comprising:

providing each of the plurality of evaluation legs with an evaluation node in which the output evaluation node is the evaluation node for a highest priority evaluation leg; and wherein said separating comprises coupling a pass device between adjacent evaluation nodes.

18. The method of claim 17, further comprising:

coupling a data device between a corresponding evaluation node and a corresponding select node of each evaluation leg and providing a corresponding data signal to the data device;

controlling the pass device of each evaluation leg with a corresponding select node;

coupling a select device between the bottom node and a corresponding select node of each evaluation leg and providing a corresponding select signal to the select device; and pre-charging each select node.

19. The method of claim 18, further comprising controlling a second data device coupled between adjacent evaluation nodes with a corresponding data signal.

20. The method of claim 17, further comprising pre-charging each evaluation node of each of the plurality of evaluation legs.

21. The method of claim 15, wherein said generating a clock signal comprises periodically pulsing the clock signal high to initiate each evaluation period.

* * * * *